US012628474B2

(12) United States Patent (10) Patent No.: US 12,628,474 B2
Huang et al. (45) Date of Patent: May 12, 2026

(54) FLIP-CHIP LIGHT-EMITTING DEVICE HAVING AT LEAST ONE STACK UNIT THAT IS FREE OF GOLD

(71) Applicant: QUANZHOU SANAN SEMICONDUCTOR TECHNOLOGY CO., LTD., Fujian (CN)

(72) Inventors: Min Huang, Fujian (CN); Yu Zhan, Fujian (CN); Zhanggen Xia, Fujian (CN); Ling-Yuan Hong, Fujian (CN); Su-Hui Lin, Fujian (CN); Chung-Ying Chang, Fujian (CN)

(73) Assignee: Quanzhou Sanan Semiconductor Technology Co., Ltd, Nanan City (CN)

( * ) Notice: Subject to any disclaimer, the term of this patent is extended or adjusted under 35 U.S.C. 154(b) by 739 days.

(21) Appl. No.: 17/939,649

(22) Filed: Sep. 7, 2022

(65) Prior Publication Data

US 2023/0077302 A1 Mar. 9, 2023

(30) Foreign Application Priority Data

Sep. 9, 2021 (CN) .......................... 202111057539.7

(51) Int. Cl.
  *H10H 20/831* (2025.01)
  *H10H 20/815* (2025.01)
  *H10H 20/857* (2025.01)
(52) U.S. Cl.
  CPC ...... *H10H 20/8312* (2025.01); *H10H 20/815* (2025.01); *H10H 20/857* (2025.01)

(58) Field of Classification Search
  CPC . H10H 20/8312; H10H 20/835; H10H 20/832
  See application file for complete search history.

(56) References Cited

U.S. PATENT DOCUMENTS

| | | | | |
|---|---|---|---|---|
| 2008/0185609 A1* | 8/2008 | Kozawa | ............... | H10H 20/835 |
| | | | | 257/E33.068 |
| 2010/0134210 A1* | 6/2010 | Umeda | .................... | H03H 3/04 |
| | | | | 333/187 |
| 2012/0199861 A1* | 8/2012 | Tsuji | .................... | H10H 20/833 |
| | | | | 257/E33.072 |
| 2013/0328096 A1* | 12/2013 | Donofrio | ............. | H10H 20/857 |
| | | | | 438/22 |
| 2014/0151711 A1* | 6/2014 | Yen | ........................ | H10H 20/84 |
| | | | | 257/98 |

\* cited by examiner

*Primary Examiner* — Lex H Malsawma
*Assistant Examiner* — Bruce R. Smith
(74) *Attorney, Agent, or Firm* — MUNCY, GEISSLER, OLDS & LOWE, P.C.

(57) ABSTRACT

A flip-chip light-emitting device includes a light-emitting unit, a first electrode, and a second electrode. The light-emitting unit includes a first type semiconductor layer, an active layer, and a second type semiconductor layer. The first electrode is disposed on the light-emitting unit and electrically connected to the first type semiconductor layer. The second electrode is disposed on the light-emitting unit and electrically connected to the second type semiconductor layer. The first electrode or the second electrode is free of gold, and includes an aluminum layer and at least one platinum layer disposed on the aluminum layer opposite to the light-emitting unit.

17 Claims, 2 Drawing Sheets

FLIP-CHIP LIGHT-EMITTING DEVICE HAVING AT LEAST ONE STACK UNIT THAT IS FREE OF GOLD

CROSS-REFERENCE TO RELATED APPLICATION

This application claims priority of Chinese Patent Application No. 202111057539.7, filed on Sep. 9, 2021.

FIELD

The disclosure relates to a light-emitting device, and more particularly to a flip-chip light-emitting device.

BACKGROUND

Flip-chip light-emitting diodes are widely applied in several fields, such as illumination, backlight, etc., for having advantageous characteristics, e.g., high efficiency in light emitting, energy saving, and long lifespan, etc.

A conventional flip-chip light-emitting diode includes semiconductor layers, metal electrodes, a transparent conductive layer, an insulation layer, and solder pads. Each of the metal electrodes is used to transport current, and is electrically connected to the corresponding semiconductor layer or the transparent conductive layer. Each of the solder pads is disposed on the corresponding metal electrode, and is used to mount the flip-chip light-emitting diode on a substrate. Each of the metal electrodes includes an aluminum layer, and an aluminum-diffusion barrier layer that is disposed on the aluminum layer. The aluminum-diffusion barrier layer includes a gold layer that has a relatively large thickness, and that is used to enhance current spreading in a horizontal direction.

In the conventional flip-chip light-emitting diode, each of the metal electrode has a thickness ranging from 1.5 μm to 2.5 μm, and the gold layer of the metal electrode has a thickness ranging from 0.6 μm to 1.2 μm. Since each of the metal electrodes has a relatively large thickness, the insulation layer on a side wall of each of the metal electrodes might be less compact. As the conventional flip-chip light-emitting diode ages, gold ions in the gold layer of each of the metal electrodes may migrate along the regions that are less compact, which might easily cause failures of the flip-chip light-emitting diode. In addition, since the gold layer might include undissolved gold particles, gold explosions might occur more easily.

As a result, due to the aforesaid drawbacks, the conventional flip-chip light-emitting diode with such low reliability no longer meets the industry standards of applications such as backlight and display screen.

SUMMARY

Therefore, an object of the disclosure is to provide a flip-chip light-emitting device that can alleviate at least one of the drawbacks of the prior art.

According to the disclosure, the flip-chip light-emitting device includes a light-emitting unit, a first electrode, and a second electrode. The light-emitting unit includes a first type semiconductor layer, an active layer, and a second type semiconductor layer that are disposed on one another in such order. The first electrode is disposed on the light-emitting unit, and is electrically connected to the first type semiconductor layer. The second electrode is disposed on the light-emitting unit, and is electrically connected to the second type semiconductor layer. At least one of the first electrode or the second electrode is free of gold, and includes an aluminum layer and a platinum layer that is disposed on the aluminum layer opposite to the light-emitting unit.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
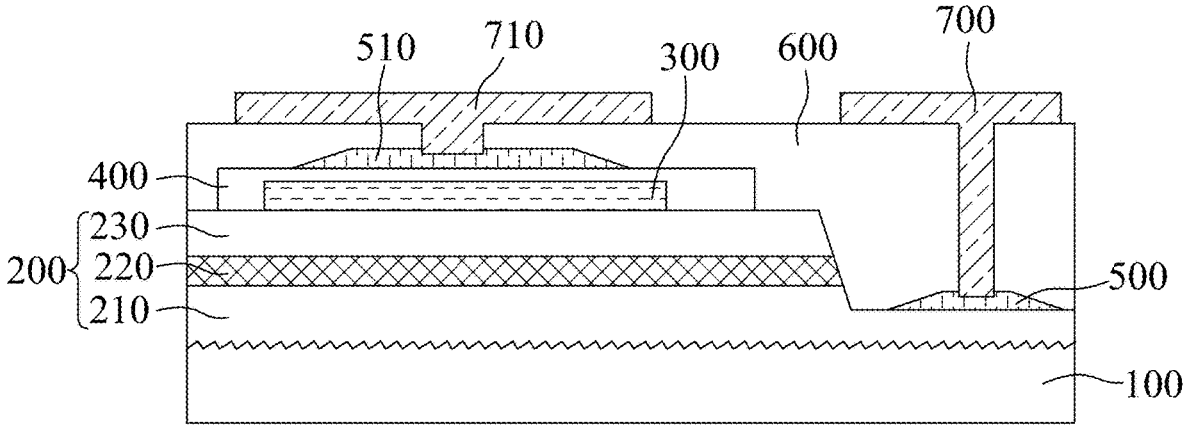
FIG. 1 is a schematic sectional view illustrating an embodiment of a flip-chip light-emitting device according to the present disclosure.

Before the disclosure is described in greater detail, it should be noted that where considered appropriate, reference numerals have been repeated among the figures to indicate corresponding or analogous elements, which may optionally have similar characteristics.

It should be noted that, the formation of a first component over or on a second component in the description below may include embodiments in which the first and second components are formed in direct contact, and may also include embodiments in which additional components may be formed between the first and second components, such that the first and second components may not be in direct contact.

A flip-chip light-emitting device according to the present disclosure may be configured as a small-sized flip-chip light-emitting device, such as a flip-chip mini light-emitting diode and a flip-chip micro light-emitting diode. In the flip-chip mini light-emitting diode, the flip-chip light-emitting device includes a transparent substrate, and has a size of not greater than 90000 μm² (i.e., the flip-chip light-emitting device having a length and a width each ranging from 50 μm to 300 μm, and a height ranging from 40 μm to 150 μm). In the flip-chip micro light-emitting diode, the flip-chip light-emitting device is free of a transparent substrate, and has a length and a width each ranging from 1 μm to 100 μm.

Referring to FIG. 1, an embodiment of the flip-chip light-emitting device according to the present disclosure includes a light-emitting unit 200, a first electrode 500, a second electrode 510, an insulation layer 600, a first electrode pad 700, and a second electrode pad 710.

The light-emitting unit 200 includes a first type semiconductor layer 210, an active layer 220, and a second type semiconductor layer 230 that are disposed on one another in such order. The term "first type" refers to the semiconductor layers 210, 230 being doped with a first conductivity type dopant, and the term "second type" refers to the semiconductor layers 210, 230 being doped with a second conductivity type dopant that is opposite in conductivity type to the first conductivity type dopant. For instance, the first conductivity type dopant may be an n-type dopant providing electrons, and the second conductivity type dopant may be an p-type dopant providing holes, and vice versa. In this embodiment, the first type semiconductor layer 210 is an n-type semiconductor layer, and the second type semiconductor layer 230 is a p-type semiconductor layer. The active layer 220 includes multiple quantum well layers, and is configured to emit light that has a predetermined wavelength (e.g., blue light, green light, etc.).

The first electrode 500 is disposed on the light-emitting unit 200, and is electrically connected to the first type semiconductor layer 210 of the light-emitting unit 200. The second electrode 510 is disposed on the light-emitting unit 200, and is electrically connected to the second type semiconductor layer 230 of the light-emitting unit 200. At least one of the first electrode 500 or the second electrode 510 is free of gold, and has a thickness of not greater than 800 nm.

In some embodiments, referring to FIG. 1, the flip-chip light-emitting device further includes a transparent conductive layer 400 that is disposed on the light-emitting unit 200, and that is electrically connected to the second type semiconductor layer 230. In such case, the second electrode 510 is dispose on the transparent conductive layer 400, and is electrically connected to the transparent conductive layer 400, i.e., the second electrode 510 is electrically connected to the second type semiconductor layer 230 of the light-emitting unit 200 through the transparent conductive layer 400. Furthermore, the transparent conductive layer 400 is made of one of indium tin oxide (ITO), gallium tin oxide (GTO), and a combination thereof.

The insulation layer 600 covers the first and second electrodes 500, 510 and an upper surface and a side surface of the light-emitting unit 200. Furthermore, the insulation layer 600 is formed with two through holes that are extended from a top surface of the insulation layer 600 and respectively terminate at surfaces of the first and second electrodes 500, 510 so as to respectively expose a part of the first electrode 500 and a part of the second electrode 510. In this embodiment, the insulation layer 600 is made of at least two types of materials, such silicon dioxide ($SiO_2$), as titanium dioxide ($TiO_2$), zinc peroxide ($ZnO_2$), zirconium dioxide ($ZrO_2$), copper (III) oxide ($Cu_2O_3$). The insulation layer 600 may include a distributed Bragg reflector (DBR), but is not limited to. The DBR is formed to have repeating paired layers by alternately depositing two types of materials (e.g., the aforesaid materials) using methods such as electron beam vapor deposition, ion beam sputtering, etc. In certain embodiments, the insulation layer 600 may be formed to have a single layer.

The first electrode pad 700 and the second electrode pad 710 are disposed on the insulation layer 600, and are respectively electrically connected to the first and second electrodes 500, 510 through the respective through holes. In this embodiment, each of the first electrode pad 700 and the second electrode pad 710 is made of one of aluminum, chromium, nickel, titanium, platinum, tin, gold, combinations thereof, and other suitable materials. Furthermore, each of the first electrode pad 700 and the second electrode pad 710 may include an adhesive layer, a reflection layer, an eutectic layer, and a protection layer that are disposed on one another in such order from an electrode side to a top side (i.e., in a direction away from the light-emitting unit 200). In certain embodiments, the adhesive layer may be a chromium layer, a titanium layer, or a combination thereof, and is used to connect the first and second electrode pads 700, 710 to the insulation layer 600. The reflection layer may be an aluminum layer, and the eutectic layer may be a nickel layer. In certain embodiments, the eutectic layer may be formed to have a paired layer. The paired layer may be a nickel/platinum paired layer, or a nickel/tin paired layer. The protection layer may be a gold layer.

Figure 2:
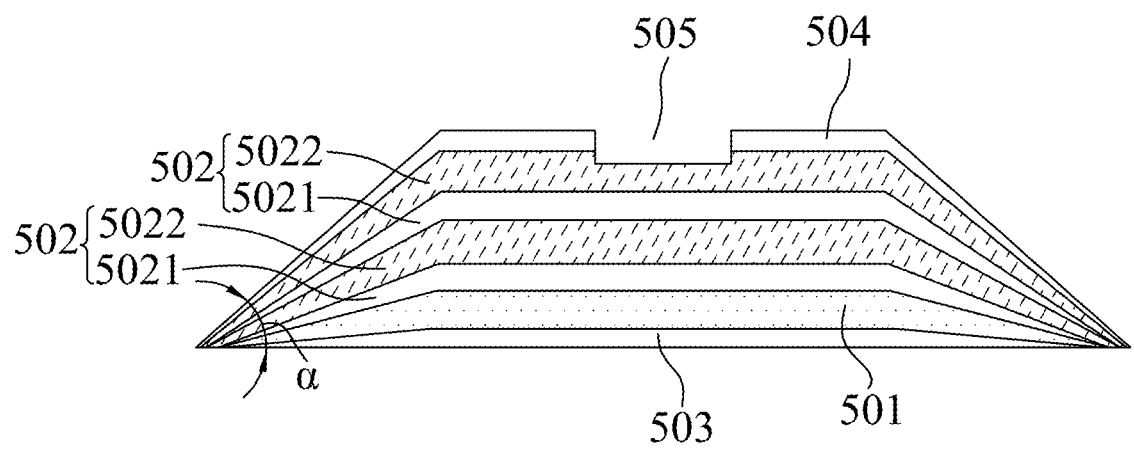
FIG. 2 is schematic sectional view illustrating a structure of an electrode of the embodiment.
Figure 3:
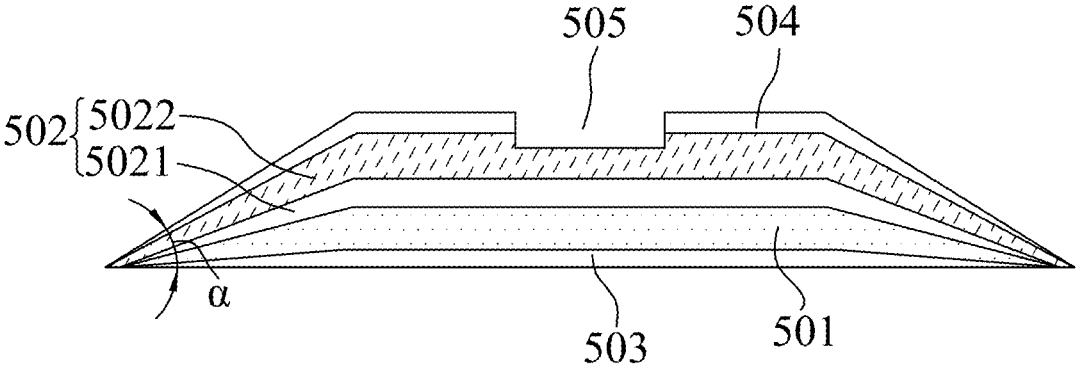
FIG. 3 is schematic sectional view illustrating another structure of the electrode of the embodiment.

FIGS. 2 and 3 demonstrate two different structures of the electrode (e.g., the first electrode 500 or the second electrode 510) of the flip-chip light-emitting device of the embodiment. The first electrode 500 is shown as an example in FIGS. 2 and 3. Referring to FIGS. 2 and 3, the first electrode 500 includes an aluminum layer 501 and at least one platinum layer 5022.

The aluminum layer 501 has a good reflectivity, and is configured to reflect light emitted by the active layer 220 of the light-emitting unit 200. In certain embodiments, the aluminum layer 501 is made of pure aluminum or an aluminum alloy with aluminum as predominant metal (e.g., copper-aluminum alloy). In this embodiment, the aluminum layer 501 has a thickness of not smaller than 80 nm. It should be noted that, in the conventional large-sized flip-chip light-emitting diode, an electrical conductive layer is formed to have multiple aluminum layers, and has a relatively large thickness for implementing current spreading in the horizontal direction. In comparison with the conventional large-sized flip-chip light-emitting diode, a driving current for the small-sized flip-chip light-emitting device of the disclosure (e.g., the flip-chip type mini light-emitting device, or the flip-chip type micro light-emitting device) is generally relatively low. Therefore, in some embodiments, the first electrode 500 may have a plurality of the aluminum layers 501 and at least one stress buffer layer (e.g., titanium layer) that is interposed between any two adjacent aluminum layers 501. In such case, each of the aluminum layers 501 has a thickness ranging from 80 nm to 300 nm, so that the aluminum layers 501 have a relatively good electrical conductivity. In some embodiments, the first electrode 500 may have one aluminum layer 501 that has a thickness of not greater than 300 nm, e.g., ranging from 100 nm to 150 nm. Since the aluminum layer 501 has a relatively small thickness, migration of aluminum may be avoided effectively, and good reflectivity may also be ensured. As a result, the small-sized flip-chip light-emitting device may become much more reliable.

The platinum layer 5022 is disposed on the aluminum layer 501 opposite to the light-emitting unit 200 to cover a top surface and a side wall of the aluminum layer 501. Platinum is relatively inactive and is unlikely to migrate, and is also able to block the migration of aluminum in the aluminum layer 501. In this embodiment, the platinum layer 5022 is disposed to completely cover the top surface and the side wall of the aluminum layer 501, and the platinum layer 5022 has a thickness of not less than 100 nm. In certain embodiments, the thickness of the platinum layer 5022 ranges from 100 nm to 300 nm. In addition, platinum further has low electrical resistivity, so that an operating voltage of the flip-chip light-emitting device may be reduced.

Referring to FIGS. 2 and 3, the first electrode 500 may further include a stress buffer layer 5021 that is disposed between the aluminum layer 501 and the at least one platinum layer 5022 of the first electrode 500. The stress buffer layer 5021 and the platinum layer 5022 that is disposed on the stress buffer layer 5021 opposite to the aluminum layer 501 form a stack unit 502. In this embodiment, the first electrode 500 includes at least one stack unit 502. In the stack unit 502, the platinum layer 5022 is located on a top surface of the stress buffer layer 5021, and the stress buffer layer 5021 is closer to the aluminum layer 501 than the platinum layer 5022. Since platinum has a relatively large stress, when forming the platinum layer 5022, cracking or curling might occur in the platinum layer 5022. The stress buffer layer 5021 could reduce the stress of the platinum layer 5022 so as to obtain the platinum layer 5022 with a good quality, thereby effectively preventing the migration of aluminum. In certain embodiments, the stress buffer layer 5021 is made of titanium.

As shown in FIG. 2, in some embodiments, the first electrode 500 includes a plurality of the stack units 502. The topmost one of the platinum layers 5022 distal from the aluminum layer 501 has a thickness greater than that of each remaining one of the platinum layers 5022. In other words, in the first electrode 500 that is composed of the stack units 502, the topmost one of the platinum layers 5022 has the greatest thickness, thereby providing a good protection to the top surface and the side wall of the aluminum layer 501. In certain embodiments, the number of the stack units 502 ranges from 2 to 3 (two stack units 502 are shown in FIG. 2). In such case, the thickness of the electrode 500 is not greater than 800 nm. In each of the stack units 502, a ratio of a thickness of the stress buffer layer 5021 to the thickness of the platinum layer 5022 is smaller than 1, i.e., the thickness of the platinum layer 5022 is greater than the thickness of the stress buffer layer 5021, thereby enhancing the electrical conductivity of the first electrode 500. It should be noted that the platinum layer 5022 having a sufficient thickness may effectively alleviate an adverse impact on the higher voltage caused by not having a gold layer in the first and second electrodes 500, 510 under low driving current. In each of the stack units 502, the thickness of the stress buffer layer 5021 ranges from 20 nm to 80 nm; the thickness of the topmost one of the platinum layers 5022 ranges from 100 nm to 300 nm; and the thickness of the each remaining one of the platinum layers 5022 is not greater than 100 nm. It should be noted that, the topmost one of the platinum layers 5022 provides complete coverage to the aluminum layer 501, especially at the side wall of the of the aluminum layer 501.

As shown in FIG. 3, in some embodiments, the first electrode 500 has only one stack unit 502. That is to say, the first electrode 500 includes the aluminum layer 501, one layer of the stress buffer layer 5021 and one layer of the platinum layer 5022. It should be noted that, since the electrical conductivity of titanium (i.e., the stress buffer layer 5021) is lower than that of platinum, the thickness of the stress buffer layer 5021 should not be too great. Therefore, similar to the structure in FIG. 2, in this embodiment, a ratio of the thickness of the stress buffer layer 5021 to the thickness of the platinum layer 5022 is also smaller than 1, i.e., the thickness of the stress buffer layer 5021 is smaller than the thickness of the platinum layer 5022. In certain embodiments, the ratio of the thickness of the stress buffer layer 5021 to the thickness of the platinum layer 5022 ranges from 1:2 to 1:8. In certain embodiments, the thickness of the stress buffer layer 5021 ranges from 20 nm to 80 nm, and the thickness of the platinum layer 5022 ranges from 100 nm to 300 nm. In such case, the migration of aluminum may effectively be avoided. It should be noted that, in this embodiment, the first electrode 500 has a thickness of not greater than 500 nm.

It should be noted that the aforesaid composition and structure of the first electrode 500 may be applied in the second electrode 510. In certain embodiments, only one of the first electrode 500 and the second electrode 510 has the aforesaid composition and structure described in FIG. 2 or 3. Alternatively, both of the first electrode 500 and the second electrode 510 have the aforesaid composition and structure described in FIG. 2 or 3.

Referring to FIGS. 1 to 3, in some embodiments, at least one of the first electrode 500 or the second electrode 510 further includes a first adhesion layer 503. The first adhesion layer 503 is disposed on a bottom surface of the aluminum layer 501. In the first electrode 500, the first adhesion layer 503 is interposed between the aluminum layer 501 and the first type semiconductor layer 210 of the light-emitting unit 200. In the second electrode 510, the first adhesion layer 503 is interposed between the aluminum layer 501 and the second type semiconductor layer 230 of the light-emitting unit 200 (or the transparent layer 400). The first adhesion layer 503 may function as an ohmic contact layer for connecting the aluminum layer 501 and the light-emitting unit 200 (or the transparent layer 400). Furthermore, the first adhesion layer 503 may be made of chromium that has a good light absorbing property, but is not limited to. In this embodiment, the first adhesion layer 503 has a thickness of not greater than 10 nm. It should be noted that the first adhesion layer 503 may only be included in one of the first electrode 500 and the second electrode 510.

Referring to FIGS. 1 to 3, in some embodiments, at least one of the first electrode 500 or the second electrode 510 further includes a second adhesion layer 504. The second adhesion layer 504 is disposed between the insulation layer 600 and the platinum layer 5022 (the topmost one of the platinum layers 5022 in FIG. 2), and provides good adhesion between the insulation layer 600 and the first and second electrodes 500, 510. In this embodiment, the second adhesion layer 504 is made of titanium, and has a thickness ranging from 10 nm to 50 nm. It should be noted that the second adhesion layer 504 may only be included in one of the first electrode 500 and the second electrode 510.

Referring to FIGS. 1 to 3, in some embodiments, the first electrode 500 is formed with a recess 505 that penetrates through the second adhesion layer 504. In some embodiments, the recess 505 penetrates through the second adhesion layer 504 and extends into the platinum layer 5022. Furthermore, when the first electrode 500 includes a plurality of the stack units 502, the recess 505 extends into the topmost one of the platinum layers 5022. The recess 505 is then in spatial communication with a corresponding one of the through holes of the insulation layer 600, and a top surface of the second adhesion layer 504 is not exposed from the corresponding one of the through hole. It should be noted that, when the top surface of the second adhesion layer 504 is exposed from the corresponding one of the through holes, oxidation may occur on the second adhesion layer 504, which increases the operating voltage of the flip-chip light-emitting device. Therefore, the aforesaid problem may be resolved by not exposing the top surface of the second adhesion layer 504 from the corresponding one of the through holes. In this embodiment, the recess 505 is configured not to penetrate through the platinum layer 5022, and a percentage of a depth of the recess 505 extending downwardly from an upper surface of the platinum layer 5022 based on the thickness of the platinum layer 5022 ranges from 1% to 50%. It should be noted that the topmost one of the platinum layers 5022 has the thickness of not less than 100 nm and completely covers the aluminum layer 501, thereby avoiding an etchant used for forming the through holes from permeating into and damage the aluminum layer 501. In certain embodiments, the first electrode 500 may include a plurality of the recesses 505, and the number of the recesses 505 of the first electrode 500 is the same as the number of corresponding through holes of the insulation layers 600. The second electrode 510 may be formed with a recess having the same structure and arrangement as the recess 505 of the first electrode 500, and the number of the recess of the second electrode 510 is the same as the number of corresponding through holes of the insulation layers 600.

It should be noted that, referring to FIGS. 1 to 3, at least one of the first electrode 500 or the second electrode 510 has an inclined side wall that has an inclined angle (α) relative to a top surface of the light-emitting unit 200 (also relative to a bottom surface thereof), and the inclined angle ($\alpha$) as a may decrease the total thickness of corresponding one of the first electrode 500 and the second electrode 510 decrease. In this embodiment, when an overall thickness of the first electrode 500 or the second electrode 510 is decreased to 800 nm, the inclined angle ($\alpha$) may be less than or equal to 60°. For example, in a case where at least one of the first electrode 500 or the second electrode 510 (the first electrode 500, the second electrode 510, or both electrodes 500, 510) includes only a layer of the stress buffer layer 5021 and a layer of the platinum layer 5022, the overall thickness of the first electrode 500 and/or the second electrode 510 is decreased, so that the inclined angle ($\alpha$) of the first electrode 500 and/or the second electrode 510 may be decreased. For instance, as the thickness of the first electrode 500 is not greater than 500 nm, the inclined angle ($\alpha$) may be not greater than 45°. In addition, as shown in FIGS. 2 and 3, since the first adhesion layer 503, the aluminum layer 501, the stress buffer layer 5021, the platinum layer 5022, and the second adhesion layer 504 are formed on one another in such order, inclined angles of such layers relative to the top surface of the light-emitting unit 200 are sequentially increased in such order.

Referring back to FIG. 1, in some embodiments, the flip-chip light-emitting device further includes a substrate 100 and a current blocking layer 300.

The substrate 100 may be one of a sapphire substrate, a silicon carbide substrate, a gallium nitride substrate, a gallium arsenide substrate, a silicon substrate, etc., but is not limited to. The substrate 100 may be patterned. In this embodiment, the substrate 100 is a patterned sapphire substrate, and the light-emitting unit 200 is formed on a top surface of the substrate 100.

The current blocking layer 300 is interposed between the second type semiconductor layer 230 of the light-emitting unit 200 and the transparent conductive layer 400, and is made of silicon oxide, silicon nitride, silicon carbide, silicon oxynitride, combinations thereof, or other suitable materials.

A method for producing the first electrode 500 and the second electrode 510 with the structure shown in FIG. 2 or 3 is described below.

In step S1, a negative photoresist is coated on the light-emitting unit 200, and the negative photoresist has a thickness ranging from 3 μm to 4 μm. The negative photoresist is formed with two holes corresponding in positions where the first electrode 500 and the second electrode 510 are to be formed. One of the holes is formed to expose a part of a top surface of the first type semiconductor layer 210 of the light-emitting unit 200 for forming the first electrode 500, and the other one of the holes is formed to expose a top surface of the second type semiconductor layer 230 of the light-emitting unit 200 (or a top surface of the transparent conductive layer 400) for forming the second electrode 510.

In step S2, an aluminum material (e.g., the pure aluminum or the aluminum alloy) is deposited in the holes of the negative photoresist to form the aluminum layers of the first and second electrodes 500, 510. Then, at least one platinum layer 5022 is deposited on each of the aluminum layers 501. It should be noted that the aluminum layers 501 and the platinum layer 5022 are also formed on a top surface of the negative photoresist.

It should be noted that, during the deposition of the aluminum material, as the thickness of the aluminum layer 501 increases, a width of the aluminum layer 501 in each of the holes decreases, so that the aluminum layer 501 is formed to have an inclined side wall. Likewise, the same phenomenon occurs during the formation of the platinum layer 5022, so that the platinum layer 5022 in each of the holes is formed to have an inclined side wall.

In addition, the platinum layer 5022 has a relatively large stress compared to the aluminum layer 501, when the platinum layer 5022 is formed on the aluminum layer 501 on the top surface of the negative photoresist, the negative photoresist may curl upwardly as the thickness of the platinum material increases, so that a diameter of an upper opening of each of the holes of the negative photoresist may be increased. Thus, in each of the holes of the negative photoresist, an edge of the platinum layer 5022 would extend beyond an edge of the aluminum layer 501 so that the platinum layer 5022 covers the side wall of the aluminum layer 501. In this embodiment, the platinum layer 5022 completely covers the top surface and the side wall of the aluminum layer 501.

In some embodiments, before forming the platinum layer 5022, a titanium material is deposited on the aluminum layer 501 for forming the stress buffer layer 5021 that is interposed between the aluminum layer 501 and the platinum layer 5022. During the deposition of the titanium material, the aforesaid phenomenon occurred during the deposition of the aluminum layer 501 and the platinum layer 5022 would also occur, so that the stress buffer layer 5021 is also formed to have an inclined side wall.

Moreover, since the titanium material has a relatively small stress compared to platinum, when depositing the titanium material on the top surface of the aluminum layer 501, a curling degree of negative resistivity might be smaller than the curling degree of the platinum layer 5022, so that the stress buffer layer 5021 may not completely cover the side wall of the aluminum layer 501.

In some embodiments, the number of the stack units 502 may be 2 (as shown in the FIG. 2) or 3. In certain embodiments, the stack unit 502 may have one layer of the stress buffer layer 5021 and one layer of the platinum layer 5022 as shown in FIG. 3. It should be noted that, upon forming the topmost one of the platinum layers 5022, the negative photoresist may further curl upwardly, so that the diameter of the upper opening of each of the holes of the negative photoresist may be further increased. Thus, the topmost one of the platinum layers 5022 has a relatively large thickness, and may completely cover the top surface and the side wall of the aluminum layer 501 to effectively protect the aluminum layer 501.

In some embodiments, before forming the aluminum layer 501, a chromium material is deposited on the first type semiconductor layer 210 and the second type semiconductor layer 230 (or the transparent conductive layer 400) for forming the first adhesion layers 503. As a result, the first adhesion layers 503 are respectively interposed between the aluminum layer 501 of the first electrode 500 and the first type semiconductor layer 210, and between the aluminum layer of the second electrode 510 and the second type semiconductor layer 230 of the light-emitting unit 200 (or the transparent conductive layer 400).

In some embodiments, the titanium material is deposited on the platinum layer 5022 (or the topmost one of the platinum layers 5022) to form the second adhesion layer 504 on the platinum layer 5022. As a result, the second adhesion layer 505 becomes the topmost layer for the first and second electrodes 500, 510.

In step S3, the negative photoresist, and the materials deposited on the top surface of the negative photoresist are removed, so as to obtain the first electrode 500 and the second electrode 510 of the flip-chip light-emitting device of the disclosure.

The flip-chip light-emitting device of the present disclosure may be applied to backlight display devices or RGB displays (e.g., televisions, smart phones, etc.). The backlight device or the RGB display may include a substrate, and a plurality of the flip-chip light-emitting devices the disclosure that are mounted on the substrate. In such case, the plurality of the flip-chip light-emitting devices (e.g., several hundreds, several thousands, several tens of thousands) may be assembled and mounted on the substrate to form a light source for the back-light display devices or the RGB displays.

In summary, since the first electrode 500 and the second electrode 510 are free of gold and have smaller thicknesses, each of the insulation layer 600, the first electrode pad 700, and the second electrode pad 710 may have good layer continuity (layer integrality) and coverage. In addition, previous issues arising from the conventional device, such as gold migration and gold explosion, are avoided with the flip-chip light-emitting device of the present disclosure. As a result, the reliability of the flip-chip light-emitting device is effectively enhanced and the manufacturing cost of the flip-chip light-emitting is reduced.

In addition, by virtue of the aluminum layer 501 and the platinum layer 5022, the first electrode 500 and the second electrode 510 deliver good reflectivity and electrical conductivity. Furthermore, in a high temperature and humidity aging test or after a period of long-term use, under the low driving current condition, the flip-chip light-emitting device of the disclosure still exhibits an electrical property on par with the conventional flip-chip light-emitting diode that has the gold layer. The platinum layer 5022 exhibits strong conductivity and migration blocking effect. When the flip-chip light-emitting device of the disclosure is in the low driving current state, the operating voltage of the flip-chip light-emitting device is more stable (i.e., the extent the operating voltage might increase is smaller). Furthermore, in the aging test and under low driving current, the first and second electrodes 500, 510 perform better in terms of reliability compared to the conventional flip-chip light-emitting diode. As a result, the flip-chip light-emitting device of the disclosure is less impacted by the increasing operating voltage. In this embodiment, the driving current for the flip-chip light-emitting should be no greater than 10 mA.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation 80 as to encompass all such modifications and equivalent arrangements.

What is claimed is:

1. A flip-chip light-emitting device, comprising:
a light-emitting unit including a first type semiconductor layer, an active layer, and a second type semiconductor layer that are disposed on one another in such order;
a first electrode disposed on said light-emitting unit and electrically connected to said first type semiconductor layer; and
a second electrode disposed on said light-emitting unit and electrically connected to said second type semiconductor layer,
wherein at least one of said first electrode or said second electrode is free of gold, and includes an aluminum layer and a platinum layer disposed on said aluminum layer opposite to said light-emitting unit;
wherein said at least one of said first electrode or said second electrode further includes a stress buffer layer disposed between said aluminum layer and said platinum layer;
wherein said at least one of said first electrode or said second electrode includes at least one stack unit that is formed by said stress buffer layer and said platinum layer disposed on said stress buffer layer;
wherein in said least one stack unit, a ratio of a thickness of said stress buffer layer to a thickness of said platinum layer is smaller than 1;
wherein said flip-chip light-emitting device further includes an insulation layer, a first electrode pad, and a second electrode pad, said insulation layer covering said first and second electrodes and an upper surface and a side surface of said light-emitting unit, said insulation layer being formed with two through holes, each of said first electrode pad and said second electrode pad being disposed on said insulation layer and electrically connected to a respective one of said first and second electrodes through a respective one of said through holes;
wherein said at least one of said first electrode or said second electrode further includes an adhesion layer disposed between said insulation layer and said platinum layer, said adhesion layer adhering to said insulation layer; and
wherein said at least one of said first electrode or said second electrode is formed with a recess that penetrates through said adhesion layer and extends into said platinum layer.

2. The flip-chip light-emitting device of claim 1, wherein said at least one of said first electrode or said second electrode has a thickness of not greater than 800 nm.

3. The flip-chip light-emitting device of claim 1, wherein said aluminum layer has a thickness of not smaller than 80 nm.

4. The flip-chip light-emitting device of claim 1, wherein said aluminum layer has a thickness of not greater than 300 nm.

5. The flip-chip light-emitting device of claim 1, wherein said at least one stack unit includes a plurality of stack units.

6. The flip-chip light-emitting device of claim 5, wherein said platinum layer of a topmost one of said plurality of stack units distal from said aluminum layer has a thickness greater than that of said platinum layer of each of remaining ones of said plurality of stack units.

7. The flip-chip light-emitting device of claim 6, wherein said platinum layer of said topmost one of said plurality of stack units has a thickness ranging from 100 nm to 300 nm.

8. The flip-chip light-emitting device of claim 6, wherein said stress buffer layer of each of said plurality of stack units has a thickness ranging from 20 nm to 80 nm, and said thickness of said platinum layer of each of said remaining ones of said plurality of stack units is not greater than 100 nm.

9. The flip-chip light-emitting device of claim 1, wherein said stress buffer layer is made of titanium.

10. The flip-chip light-emitting device of claim 1, wherein the thickness of said platinum layer ranges from 100 nm to 300 nm.

11. The flip-chip light-emitting device of claim 1, wherein said at least one of said first electrode or said second electrode has a thickness not greater than 500 nm.

12. The flip-chip light-emitting device of claim 1, wherein a percentage of a depth of said recess extending downwardly from an upper surface of said platinum layer based on said thickness of said platinum layer ranges from 1% to 50%.

13. The flip-chip light-emitting device of claim 12, wherein said recess is spatially communicated with the respective one of said through holes.

14. The flip-chip light-emitting device of claim 1, wherein said adhesion layer is made of titanium.

15. A flip-chip light-emitting device, comprising:

a light-emitting unit including a first type semiconductor layer, an active layer, and a second type semiconductor layer that are disposed on one another in such order;

a first electrode disposed on said light-emitting unit and electrically connected to said first type semiconductor layer;

a second electrode disposed on said light-emitting unit and electrically connected to said second type semiconductor layer;

an insulation layer;

a first electrode pad; and a second electrode pad, said insulation layer covering said first and second electrodes and an upper surface and a side surface of said light-emitting unit, said insulation layer being formed with two through holes, each of said first electrode pad and said second electrode pad being disposed on said insulation layer and electrically connected to a respective one of said first and second electrodes through a respective one of said through holes, wherein at least one of said first electrode or said second electrode is free of gold, and includes an aluminum layer and a platinum layer disposed on said aluminum layer opposite to said light-emitting unit;

wherein said at least one of said first electrode or said second electrode further includes an adhesion layer disposed between said insulation layer and said platinum layer, said adhesion layer adhering to said insulation layer; and wherein said at least one of said first electrode or said second electrode is formed with a recess that penetrates through said adhesion layer and extends into said platinum layer.

16. The flip-chip light-emitting device of claim 15, wherein a percentage of a depth of said recess extending downwardly from an upper surface of said platinum layer based on said thickness of said platinum layer ranges from 1% to 50%.

17. The flip-chip light-emitting device of claim 16, wherein said recess is spatially communicated with the respective one of said through holes.

\* \* \* \* \*